United States Patent
Khlat (10) Patent No.: US 12,401,279 B2
(45) Date of Patent: Aug. 26, 2025

(54) EFFICIENCY IMPROVEMENT IN A POWER MANAGEMENT INTEGRATED CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 39 days.

(21) Appl. No.: 18/420,981

(22) Filed: Jan. 24, 2024

(65) Prior Publication Data

US 2024/0333158 A1    Oct. 3, 2024

Related U.S. Application Data

(60) Provisional application No. 63/471,295, filed on Jun. 6, 2023, provisional application No. 63/493,322, filed on Mar. 31, 2023.

(51) Int. Cl.
| | |
|---|---|
| H02M 3/158 | (2006.01) |
| H02M 1/44 | (2007.01) |
| H03H 7/01 | (2006.01) |

(52) U.S. Cl.
CPC ........... *H02M 3/1582* (2013.01); *H02M 1/44* (2013.01); *H03H 7/0115* (2013.01)

(58) Field of Classification Search
CPC ................................................. H02M 3/1582
USPC ......................................................... 327/540
See application file for complete search history.

(56) References Cited

U.S. PATENT DOCUMENTS

| | | | |
|---|---|---|---|
| 10,103,926 B1 | 10/2018 | Khlat | |
| 10,270,345 B1 | 4/2019 | Kotikalapoodi | |
| 10,523,120 B2 | 12/2019 | Youn et al. | |
| 10,797,649 B2 | 10/2020 | Khlat | |
| 11,424,719 B2 * | 8/2022 | Khlat | ..................... H03F 1/0233 |
| 2009/0191826 A1 | 7/2009 | Takinami et al. | |
| 2012/0194274 A1 | 8/2012 | Fowers et al. | |
| 2016/0006397 A1 | 1/2016 | Wimpenny | |

(Continued)

FOREIGN PATENT DOCUMENTS

| | | |
|---|---|---|
| CN | 116505631 A | 7/2023 |
| WO | 2021262185 A1 | 12/2021 |

OTHER PUBLICATIONS

Extended European Search Report for European Patent Application No. 24166661.9, mailed Aug. 7, 2024, 8 pages.

*Primary Examiner* — Tomi Skibinski
(74) *Attorney, Agent, or Firm* — Withrow & Terranova, P.L.L.C.

(57) ABSTRACT

Efficiency improvement in a power management integrated circuit (PMIC) is provided. The PMIC includes a voltage modulation circuit configured to generate a modulated voltage, such as an envelope tracking (ET) voltage, for a load circuit and a low-frequency current source configured to provide a low-frequency current to the load circuit. However, since the modulated voltage can be associated with a wide modulation bandwidth that exceeds a bandwidth limitation of the low-frequency current source, the voltage modulation circuit may be forced to source or sink a high-frequency current for the load circuit at an expense of reduced efficiency. In this regard, in embodiments disclosed herein, a high-frequency current source can be activated to source or sink the high-frequency current for the voltage modulation circuit. As a result, the voltage modulation circuit can maintain a higher efficiency across the wide modulation bandwidth.

21 Claims, 5 Drawing Sheets

(56) References Cited

U.S. PATENT DOCUMENTS

| | | |
|---|---|---|
| 2020/0274494 A1 | 8/2020 | Khlat |
| 2021/0226585 A1 | 7/2021 | Khlat |
| 2022/0200447 A1 | 6/2022 | Khlat |
| 2023/0066436 A1 | 3/2023 | Rutkowski |
| 2023/0118768 A1 | 4/2023 | Khlat |
| 2023/0124941 A1 | 4/2023 | Khlat |
| 2023/0216409 A1 | 7/2023 | Ravi et al. |
| 2024/0014787 A1* | 1/2024 | Khlat ................ H03F 3/245 |

* cited by examiner

EFFICIENCY IMPROVEMENT IN A POWER MANAGEMENT INTEGRATED CIRCUIT

RELATED APPLICATIONS

This application claims the benefit of U.S. provisional patent application Ser. No. 63/493,322, filed on Mar. 31, 2023, and U.S. provisional patent application Ser. No. 63/471,295, filed on Jun. 6, 2023, the disclosures of which are hereby incorporated herein by reference in their entireties.

FIELD OF THE DISCLOSURE

The technology of the disclosure relates generally to a power management integrated circuit (PMIC) for generating an envelope tracking (ET) and/or an average power tracking (APT) voltage.

Background

Fifth generation (5G) new radio (NR) (5G-NR) has been widely regarded as the next generation of wireless communication technology beyond the current third generation (3G) and fourth generation (4G) technologies. In this regard, a wireless communication device capable of supporting the 5G-NR wireless communication technology is expected to achieve higher data rates, improved coverage range, enhanced signaling efficiency, and reduced latency across a wide range of radio frequency (RF) bands, which include a low-band (below 1 GHz), a mid-band (1 GHz to 6 GHz), and a high-band (above 24 GHz).

Downlink and uplink transmissions in a 5G-NR system are widely based on orthogonal frequency division multiplexing (OFDM). In a 5G-NR communication system, an RF signal can be modulated into multiple subcarriers in frequency domain and multiple OFDM symbols in time domain. The table (Table 1) below summarizes OFDM configurations supported by the 5G-NR communication system.

TABLE 1

| SCS (KHz) | Slot Length (µs) | # of Slots per Subframe | CP (µs) | OFDM Symbol Duration (µs) | Modulation Bandwidth (MHz) |
|---|---|---|---|---|---|
| 15 | 1000 | 1 | 4.69 | 71.43 | 50 |
| 30 | 500 | 2 | 2.34 | 35.71 | 100 |
| 60 | 250 | 4 | 1.17 | 17.86 | 200 |
| 120 | 125 | 8 | 0.59 | 8.93 | 400 |

In the 5G-NR communication system, the RF signal is typically modulated with a high modulation bandwidth in excess of 200 MHz. In this regard, according to Table 1, the SCS will be 120 KHz and a transition settling time between two consecutive OFDM symbols needs to be less than or equal to the CP duration of 0.59 µs.

Notably, the wireless communication device relies on a battery cell (e.g., Li-ion battery) to power its operations and services. Despite recent advancements in battery technologies, the wireless communication device can run into a low battery situation from time to time. In this regard, it is desirable to prolong battery life concurrent to enabling fast voltage changes between OFDM symbols.

SUMMARY

Embodiments of the disclosure relate to efficiency improvement in a power management integrated circuit (PMIC). The PMIC includes a voltage modulation circuit configured to generate a modulated voltage, such as an envelope tracking (ET) voltage, for a load circuit (e.g., power amplifier) and a low-frequency current source configured to provide a low-frequency current to the load circuit. However, since the modulated voltage can be associated with a wide modulation bandwidth (e.g., 40 to 500 MHz) that exceeds a bandwidth limitation of the low-frequency current source, the voltage modulation circuit may be forced to source or sink a high-frequency current for the load circuit at an expense of reduced efficiency. In this regard, in embodiments disclosed herein, a high-frequency current source can be activated to source or sink the high-frequency current for the voltage modulation circuit. By relieving the voltage modulation circuit from having to source or sink the high-frequency current, the voltage modulation circuit can maintain a higher efficiency across the wide modulation bandwidth.

In one aspect, a PMIC is provided. The PMIC includes a voltage modulation circuit. The voltage modulation circuit is configured to generate a modulated voltage at a voltage output based on a modulated target voltage to thereby cause a modulated current comprising one or more of a modulated low-frequency current and a modulated high-frequency current in a load circuit coupled to the voltage output. The PMIC also includes a low-frequency current source. The low-frequency current source is configured to generate the modulated low-frequency current in the modulated current. The PMIC also includes a high-frequency current source. The high-frequency current source is activated when a modulation bandwidth of the modulated voltage exceeds a bandwidth limitation of the low-frequency current source to thereby supplement the modulated high-frequency current in the modulated current.

In another aspect, a wireless device is provided. The wireless device includes a power amplifier circuit. The wireless device also includes a PMIC. The PMIC includes a voltage output coupled to the power amplifier circuit. The PMIC also includes a voltage modulation circuit. The voltage modulation circuit is configured to generate a modulated voltage at the voltage output based on a modulated target voltage to thereby cause a modulated current comprising one or more of a modulated low-frequency current and a modulated high-frequency current in the power amplifier circuit. The PMIC also includes a low-frequency current source. The low-frequency current source is configured to generate the modulated low-frequency current in the modulated current. The PMIC also includes a high-frequency current source. The high-frequency current source is activated when a modulation bandwidth of the modulated voltage exceeds a bandwidth limitation of the low-frequency current source to thereby supplement the modulated high-frequency current in the modulated current.

In another aspect, a method for operating a PMIC is provided. The method includes generating a modulated voltage based on a modulated target voltage to thereby cause a modulated current comprising one or more of a modulated low-frequency current and a modulated high-frequency current in a load circuit. The method also includes generating, using a low-frequency current source, the modulated low-frequency current in the modulated current. The method also includes activating a high-frequency current source when a modulation bandwidth of the modulated voltage exceeds a bandwidth limitation of the low-frequency current source to thereby supplement the modulated high-frequency current in the modulated current.

In another aspect, a PMIC is provided. The PMIC includes a voltage modulation circuit. The voltage modulation circuit is configured to generate a modulated voltage at a voltage output based on a modulated target voltage to thereby cause a modulated current comprising one or more of a modulated low-frequency current and a modulated high-frequency current in a load circuit coupled to the voltage output. The PMIC also includes a low-frequency current source. The low-frequency current source is configured to generate the modulated low-frequency current in the modulated current based on a low-frequency pulse-width-modulation (PWM) duty cycle signal. The PMIC also includes a high-frequency current source. The high-frequency current source is activated when a modulation bandwidth of the modulated voltage exceeds a bandwidth limitation of the low-frequency current source to thereby supplement the modulated high-frequency current in the modulated current based on a high-frequency PWM duty cycle signal at least ten times faster than the low-frequency PWM duty cycle signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to efficiency improvement in a power management integrated circuit (PMIC). The PMIC includes a voltage modulation circuit configured to generate a modulated voltage, such as an envelope tracking (ET) voltage, for a load circuit (e.g., power amplifier) and a low-frequency current source configured to provide a low-frequency current to the load circuit. However, since the modulated voltage can be associated with a wide modulation bandwidth (e.g., 40 to 500 MHz) that exceeds a bandwidth limitation of the low-frequency current source, the voltage modulation circuit may be forced to source or sink a high-frequency current for the load circuit at the expense of reduced efficiency. In this regard, in embodiments disclosed herein, a high-frequency current source can be activated to source or sink the high-frequency current for the voltage modulation circuit. By relieving the voltage modulation circuit from having to source or sink the high-frequency current, the voltage modulation circuit can maintain a higher efficiency across the wide modulation bandwidth.

Figure 1:
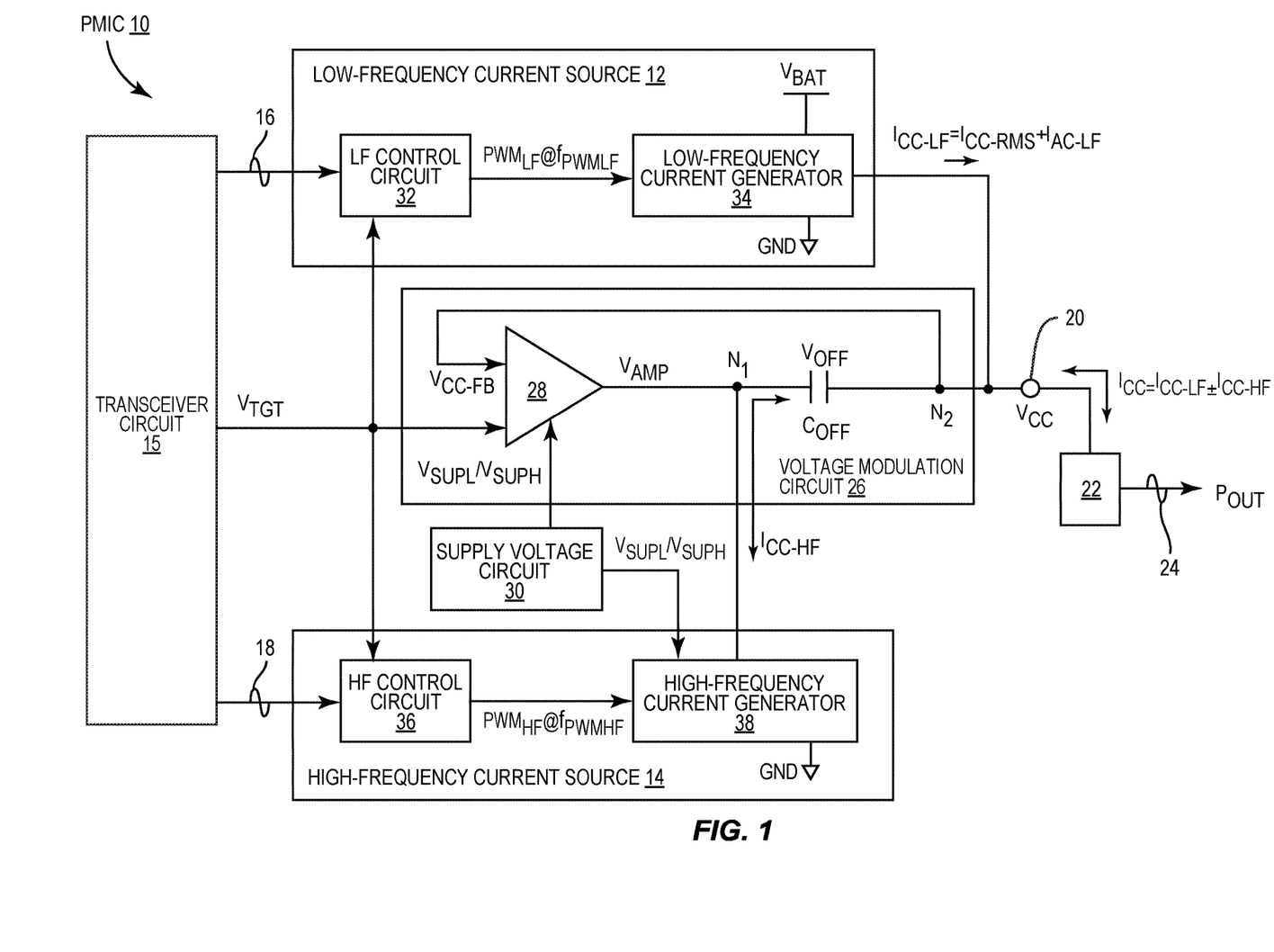
FIG. 1 is a schematic diagram of an exemplary power management integrated circuit (PMIC) wherein a low-frequency current source and a high-frequency current source can be configured according to embodiments of the present disclosure to improve efficiency of the PMIC across a wide modulation bandwidth.

In this regard, FIG. 1 is a schematic diagram of an exemplary PMIC 10 wherein a low-frequency current source 12 and a high-frequency current source 14 can be configured according to embodiments of the present disclosure to improve efficiency of the PMIC 10 across a wide modulation bandwidth. In an embodiment, each of the low-frequency current source 12 and the high-frequency current source 14 can be controlled by a transceiver circuit 15 via a respective one of a low-frequency control signal 16 and a high-frequency control signal 18. In a non-limiting example, the low-frequency control signal 16 and the high-frequency control signal 18 can be provided to the low-frequency current source 12 and the high-frequency current source 14 via respective radio frequency (RF) frontend (RFFE) interfaces. In an embodiment, each of the low-frequency control signal 16 and the high-frequency control signal 18 can be used to activate/deactivate and/or set frequency for a respective one of the low-frequency current source 12 and the high-frequency current source 14.

The PMIC 10 includes a voltage output 20, which is coupled to a load circuit 22. In an embodiment, the load circuit 22 can be a power amplifier configured to amplify an RF signal 24 to a time-variant output power $P_{OUT}$ as a function of a modulated voltage $V_{CC}$ (e.g., an ET voltage) and a modulated current $I_{CC}$ ($P_{OUT}=V_{CC} \times I_{CC}$). Herein, the PMIC 10 is configured to provide the modulated voltage $V_{CC}$ and the modulated current $I_{CC}$ in accordance with the time-variant output power $P_{OUT}$. In another embodiment, the load circuit 22 may be a low-noise amplifier (LNA). In another embodiment, the load circuit 22 may also be an electronic device that operates based on a time-variant supply voltage.

In an embodiment, the PMIC 10 includes a voltage modulation circuit 26. The voltage modulation circuit 26 is configured to generate the modulated voltage $V_{CC}$ based on a modulated target voltage $V_{TGT}$. The modulated target voltage $V_{TGT}$ may also be generated by the transceiver circuit to track the time-variant output power $P_{OUT}$ and provided to the voltage modulation circuit 26 via a respective RFFE interface.

In an embodiment, the voltage modulation circuit 26 includes a voltage modulator 28 and an offset capacitor $C_{OFF}$. The voltage modulator 28 is configured to generate a modulated initial voltage $V_{AMP}$ based on the modulated target voltage $V_{TGT}$. The offset capacitor $C_{OFF}$ has an input node $N_1$ coupled to the voltage modulator 28 and an output node $N_2$ coupled to the voltage output 20. Herein, the offset capacitor $C_{OFF}$ is configured to raise the modulated initial voltage $V_{AMP}$ by an offset voltage $V_{OFF}$ to thereby generate the modulated voltage $V_{CC}$ ($V_{CC}=V_{AMP}+V_{OFF}$) at the voltage output 20. In a non-limiting example, the offset voltage $V_{OFF}$ can be a constant voltage that equals a minimum of the modulated voltage $V_{CC}$.

In a non-limiting example, the voltage modulator 28 can be a voltage amplifier that operates based on a selected one of multiple supply voltages $V_{SUPL}$, $V_{SUPH}$ ($V_{SUPL}<V_{SUPH}$). Accordingly, a supply voltage circuit 30 is provided in the PMIC 10 to generate the supply voltages $V_{SUPL}$, $V_{SUPH}$.

In an embodiment, the low-frequency current source 12 includes a low-frequency control circuit 32 and a low-frequency current generator 34. As described in detail in FIG. 2, the low-frequency control circuit 32 is configured to generate a low-frequency pulse-width modulation (PWM) duty cycle signal $PWM_{LF}$ based on the low-frequency control signal 16 and the modulated target voltage $V_{TGT}$. In a non-limiting example, the low-frequency PWM duty cycle signal $PWM_{LF}$ has a respective frequency $f_{PWMLF}$ of approximately 3 to 4 MHz.

The low-frequency current generator 34 is configured to generate a modulated low-frequency current $I_{CC-LF}$ based on a battery voltage VBAT and in accordance with the low-frequency PWM duty cycle signal $PWM_{LF}$. The low-frequency current generator 34 is coupled to the voltage output 20. Accordingly, the low-frequency current generator 34 can provide the modulated low-frequency current $I_{CC-LF}$ to the load circuit 22 as part of the modulated current $I_{CC}$ ($I_{CC-LF} \in I_{CC}$).

The modulated low-frequency current $I_{CC-LF}$ includes a constant current $I_{CC-RMS}$ and a low-frequency alternating current $I_{AC-LF}$ ($I_{CC-LF}=I_{CC-RMS}+I_{AC-LF}$). Herein, the constant current $I_{CC-RMS}$ is equal to a root-mean-square (RMS) average of the modulated current $I_{CC}$. As for the low-frequency alternating current $I_{AC-LF}$, as the name suggests, it is a slow-varying alternating current whose modulation frequency is subject to a bandwidth limitation of the low-frequency current generator 34 (e.g., ≤20 MHz). In this regard, when a modulation bandwidth associated with the modulated voltage $V_{CC}$ and/or the modulated current $I_{CC}$ is below the bandwidth limitation of the low-frequency current generator 34, the modulated low-frequency current $I_{CC-LF}$ will be sufficient for the load circuit 22. As such, the high-frequency current source 14 may be deactivated to help reduce power consumption and promote efficiency in the PMIC 10.

When the modulation bandwidth associated with the modulated voltage $V_{CC}$ and/or the modulated current $I_{CC}$ exceeds the bandwidth limitation of the low-frequency current source 12, the modulated low-frequency current $I_{CC-LF}$ will become insufficient for the load circuit 22. As such, in an embodiment of the present disclosure, the high-frequency current source 14 can be activated to source or sink a modulated high-frequency current $I_{CC-HF}$ in the modulated current $I_{CC}$. By activating the high-frequency current source 14 to source or sink the modulated high-frequency current $I_{CC-HF}$, as opposed to forcing the voltage modulator 28 to do so, the voltage modulation circuit 26 can maintain a higher efficiency across the wide modulation bandwidth of the modulated voltage $V_{CC}$ and/or the modulated current $I_{CC}$.

In an embodiment, the high-frequency current source 14 includes a high-frequency control circuit 36 and a high-frequency current generator 38. The high-frequency control circuit 36 is configured to generate a high-frequency PWM duty cycle signal $PWM_{HF}$ based on the high-frequency control signal 18 and the modulated target voltage $V_{TGT}$. In an embodiment, the high-frequency PWN duty cycle signal $PWM_{HF}$ has a respective frequency $f_{PWMHF}$ that is an integer multiple (M>1) of the respective frequency $f_{PWMLF}$ of the low-frequency PWM duty cycle signal $PWM_{LF}$ ($f_{PWMHF}=M \times f_{PWMLF}$). In a non-limiting example, the integer multiple M is equal to ten (M=10). Accordingly, the respective frequency $f_{PWMHF}$ of the high-frequency PWN duty cycle signal $PWM_{HF}$ is ten times the respective frequency $f_{PWMLF}$ of the low-frequency PWN duty cycle signal $PWM_{LF}$ ($f_{PWMHF}=10 \times f_{PWMLF}$).

The high-frequency current generator 38 is configured to generate the modulated high-frequency current $I_{CC-HF}$ based on the supply voltages $V_{SUPL}$, $V_{SUPH}$ and in accordance with the high-frequency PWM duty cycle signal $PWM_{HF}$. In an embodiment, the high-frequency current generator 38 is coupled to the input node $N_1$ of the offset capacitor $C_{OFF}$. In this regard, when the modulated voltage $V_{CC}$ and/or the modulated current $I_{CC}$ increases in modulation frequency, the high-frequency current generator 38 can source the modulated high-frequency current $I_{CC-HF}$ to the load circuit 22 such that the modulated load current $I_{CC}$ would equal a sum of the modulated low-frequency current $I_{CC-LF}$ and the modulated high-frequency current $I_{CC-HF}$ ($I_{CC}=I_{CC-LF}+I_{CC-HF}$). When the modulated voltage $V_{CC}$ and/or the modulated current $I_{CC}$ decreases in modulation frequency, the high-frequency current generator 38 will sink (a.k.a. take away) the modulated high-frequency current $I_{CC-HF}$ from the load circuit 22 to a ground (GND). As a result, the modulated load current $I_{CC}$ would equal the modulated low-frequency current $I_{CC-LF}$ minus the modulated high-frequency current $I_{CC-HF}$ ($I_{CC}=I_{CC-LF}-I_{CC-HF}$).

Figure 2:
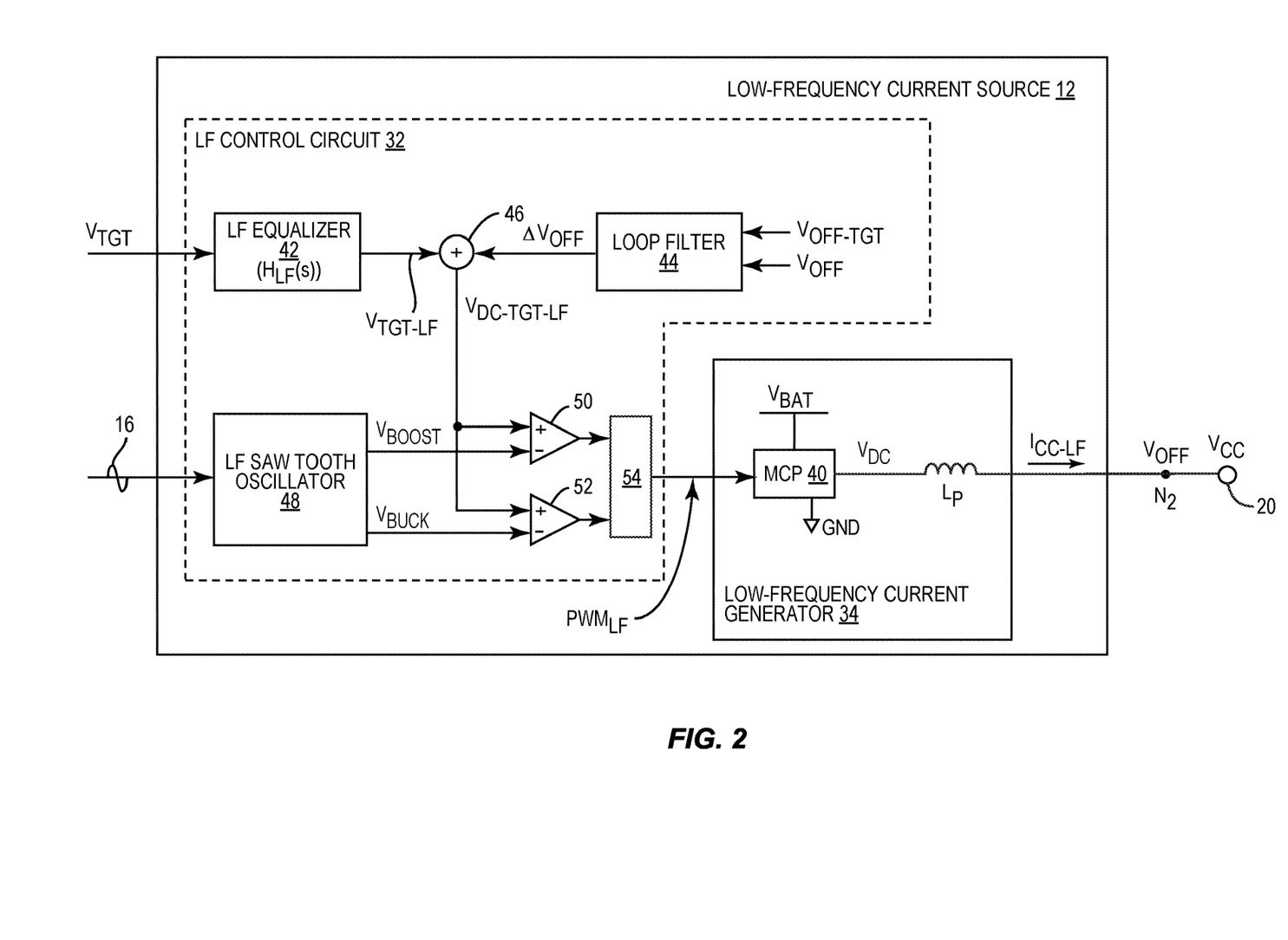
FIG. 2 is a schematic diagram of the low-frequency current source in the PMIC of FIG. 1 configured according to an embodiment of the present disclosure to generate a low-frequency current in the PMIC.

FIG. 2 is a schematic diagram of the low-frequency current source 12 configured according to an embodiment of the present disclosure. Common elements between FIGS. 1 and 2 are shown therein with common element numbers and will not be re-described herein.

The low-frequency current generator 34 includes a multi-level charge pump (MCP) 40 and a power inductor $L_P$. In a non-limiting example, the MCP 40 can be a buck-boost voltage converter configured to generate a low-frequency voltage $V_{DC}$ based on the battery voltage $V_{BAT}$. According to an embodiment of the present disclosure, the MCP 40 can operate in a buck mode to generate the low-frequency voltage $V_{DC}$ at either zero volt (0 V) or the battery voltage $V_{BAT}$, or in a boost mode to generate the low-frequency voltage $V_{DC}$ at two times the battery voltage $V_{BAT}$ ($2\times V_{BAT}$). Herein, the MCP 40 is further configured to alternate the low-frequency voltage $V_{DC}$ between 0 V, $V_{BAT}$, and/or $2\times V_{BAT}$ in accordance with the low-frequency PWM duty cycle signal $PWM_{LF}$ (e.g., 30%@0 V, 33%@$V_{BAT}$, and 37%@$2\times V_{BAT}$). Accordingly, by generating the low-frequency PWM duty cycle signal $PWM_{LF}$ appropriately, the MCP 40 can generate the low-frequency voltage $V_{DC}$ at any appropriate voltage levels.

The power inductor $L_P$ is coupled to the voltage output 20 and configured to induce the modulated low-frequency current $I_{CC-LF}$ based on the low-frequency voltage $V_{DC}$. Herein, the power inductor $L_P$ is configured to have a relatively large inductance (e.g., 2.2 µF) to help suppress a possible ripple in the low-frequency voltage $V_{DC}$. However, the relatively large inductance of the power inductor $L_P$ can also limit the ability of the low-frequency current generator 34 in generating the low-frequency alternating current $I_{AC-LF}$ beyond a certain modulation frequency, thus creating the need for the high-frequency alternating current IAC-HF in the PMIC 10.

In an embodiment, the low-frequency control circuit 32 includes a low-frequency equalizer 42, a loop filter 44, a low-frequency mixer 46, a low-frequency saw tooth oscillator 48, a boost-mode comparator 50, a buck-mode comparator 52, and a low-frequency arbitration logic 54. The low-frequency equalizer 42 is configured to apply a low-frequency equalization filter $H_{LF}(s)$ to the modulated target voltage $V_{TGT}$ to generate a modulated low-frequency target voltage $V_{TGT-LF}$. Herein, the modulated low-frequency target voltage $V_{TGT-LF}$ is configured to cause the low-frequency current generator 34 to generate the low-frequency alternating current $I_{AC-LF}$ in the modulated low-frequency current $I_{CC-LF}$.

The loop filter 44 is configured to generate an offset voltage error $\Delta V_{OFF}$ by comparing an offset target voltage $V_{OFF-TGT}$ and the offset voltage $V_{OFF}$ in the voltage modulation circuit 26. Herein, the offset voltage error $\Delta V_{OFF}$ is configured to cause the low-frequency current generator 34 to adjust the constant current $I_{CC-RMS}$ in the modulated low-frequency current $I_{CC-LF}$. The low-frequency mixer 46 is configured to combine the modulated low-frequency target voltage $V_{TGT-LF}$ and the offset voltage error $\Delta V_{OFF}$ to generate a low-frequency voltage target $V_{DC-TGT-LF}$ for setting the low-frequency PWM duty cycle signal $PWM_{LF}$. The low-frequency mixer 46 is configured to provide the low-frequency voltage target $V_{DC-TGT-LF}$ to respective positive inputs (denoted as "+") of the boost-mode comparator 50 and the buck-mode comparator 52.

The low-frequency saw tooth oscillator 48 is configured to generate a boost-mode target voltage VBOOST and a buck-mode target voltage $V_{BUCK}$ based on the low-frequency control signal 16. The low-frequency saw tooth oscillator 48 is further configured to provide the boost-mode target voltage VBOOST and the buck-mode target voltage $V_{BUCK}$ to respective negative inputs (denoted as "−") of the boost-mode comparator 50 and the buck-mode comparator 52. The low-frequency arbitration logic 54 is configured to generate the low-frequency PWM duty cycle signal $PWM_{LF}$ based on outputs from the boost-mode comparator 50 and the buck-mode comparator 52.

Figure 3:
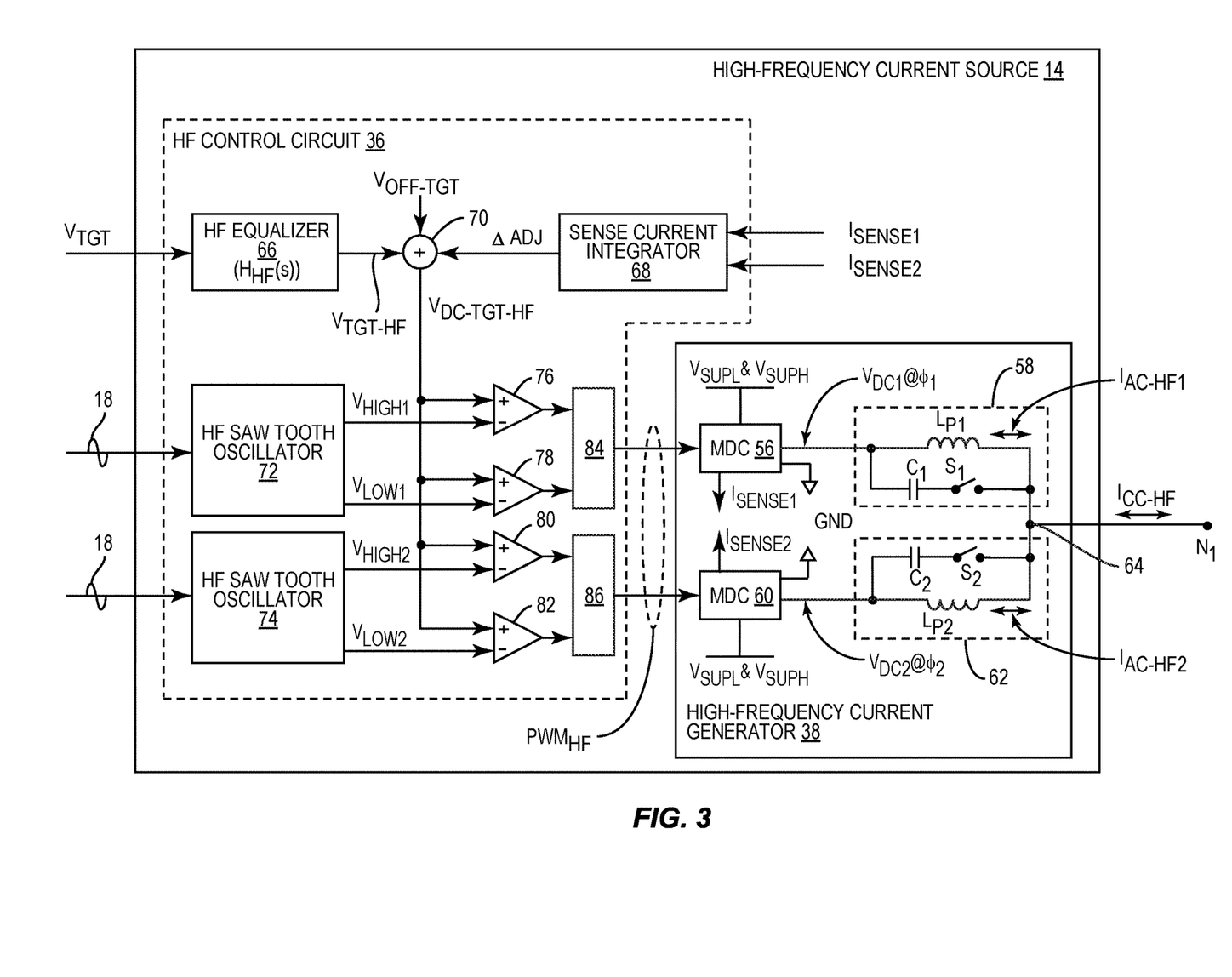
FIG. 3 is a schematic diagram of the high-frequency current source in the PMIC of FIG. 1 configured according to an embodiment of the present disclosure to supplement a high-frequency current in the PMIC.

FIG. 3 is a schematic diagram of the high-frequency current source 14 configured according to an embodiment of the present disclosure. Common elements between FIGS. 1 and 3 are shown therein with common element numbers and will not be re-described herein.

The high-frequency current generator 38 includes a first multi-level voltage converter 56 (denoted as "MDC") that is coupled to a first inductor-capacitor (LC) filter 58. The first LC filter 58 includes a first inductor $L_{P1}$, a first capacitor $C_1$, and a first switch S1 configured as illustrated herein. The high-frequency current generator 38 also includes a second multi-level voltage converter 60 (also denoted as "MDC") that is coupled to a second LC filter 62. The second LC filter 62 includes a second inductor $L_{P2}$, a second capacitor $C_2$, and a second switch $S_2$ configured as illustrated herein.

In an embodiment, each of the first multi-level voltage converter 56 and the second multi-level voltage converter 60 can operate in a low-voltage mode to generate a respective one of a first voltage $V_{DC1}$ and a second voltage $V_{DC2}$ at 0 V or the lower supply voltage $V_{SUPL}$, or in a high-voltage mode to generate the respective one of the first voltage $V_{DC1}$ and the second voltage $V_{DC2}$ at the higher supply voltage $V_{SUPH}$.

Herein, each of the first multi-level voltage converter 56 and the second multi-level voltage converter 60 is further configured to alternate the respective one of the first voltage $V_{DC1}$ and the second voltage $V_{DC2}$ between 0 V, $V_{SUPL}$, and/or $V_{SUPH}$ in accordance with the high-frequency PWM duty cycle signal $PWM_{HF}$ (e.g., 30%@0 V, 30%@$V_{SUPL}$, and 40%@$V_{SUPH}$). Accordingly, by generating the high-frequency PWM duty cycle signal $PWM_{HF}$ appropriately, the MCP 40 can generate the respective one of the first voltage $V_{DC1}$ and the second voltage $V_{DC2}$ at any appropriate voltage levels.

The first power inductor $L_{P1}$ is configured to induce a first high-frequency alternating current $I_{AC-HF1}$ based on the first voltage $V_{DC1}$. The second power inductor $L_{P2}$ is configured to induce a second high-frequency alternating current $I_{AC-HF2}$ based on the second voltage $V_{DC2}$. The first high-frequency alternating current $I_{AC-HF1}$ and the second high-frequency alternating current $I_{AC-HF2}$ converge at a converging node 64 to form the modulated high-frequency current $I_{CC-HF}$ ($I_{CC-HF}=I_{AC-HF1}+I_{AC-HF2}$).

Herein, each of the first power inductor $L_{P1}$ and the second power inductor $L_{P2}$ is configured to have a far smaller inductance (e.g., <100 nH) than the power inductor $L_P$ in the low-frequency current source 12. Understandably, by configuring the first power inductor $L_{P1}$ and the second power inductor $L_{P2}$ with the smaller inductance, the high-frequency current generator 38 can adapt the first high-frequency alternating current $I_{AC-HF1}$ and the second high-frequency alternating current $I_{AC-HF2}$, and therefore the modulated high-frequency current $I_{CC-HF}$, at a higher frequency, thus making it possible to adapt the modulated current $I_{CC}$ at a higher modulation frequency.

However, reducing the respective inductance of the first power inductor $L_{P1}$ and the second power inductor $L_{P2}$ may cause unwanted ripples in the first voltage $V_{DC1}$ and the second voltage $V_{DC2}$. In this regard, it is necessary to configure the high-frequency current generator 38 to suppress the unwanted ripples in the first voltage $V_{DC1}$ and the second voltage $V_{DC2}$.

In this regard, the first multi-level voltage converter 56 is configured to generate the first voltage $V_{DC1}$ at a first phase $\Phi 1$, and the second multi-level voltage converter 60 is configured to generate the second voltage $V_{DC2}$ at a second phase $\Phi 2$. In an embodiment, the first phase $\Phi 1$ and the second phase $\Phi 2$ may be so determined to have a one-hundred eighty degrees (180°) phase offset such that the unwanted ripple in the first voltage $V_{DC1}$ and the second voltage $V_{DC2}$ can cancel each other. Moreover, the first LC filter 58 and the second LC filter 62 may be configured (e.g., by closing the first switch $S_1$ and the second switch $S_2$) to provide ripple cancellation at a certain parallel resonance frequency or harmonic frequency, as desired.

In an embodiment, the high-frequency control circuit 36 includes a high-frequency equalizer 66, a sense current integrator 68, a high-frequency mixer 70, a first high-frequency saw tooth oscillator 72, a second high-frequency saw tooth oscillator 74, a first high-voltage mode comparator 76, a first low-voltage mode comparator 78, a second high-voltage mode comparator 80, a second low-voltage mode comparator 82, a first high-frequency arbitration logic 84, and a second high-frequency arbitration logic 86.

The high-frequency equalizer 66 is configured to apply a high-frequency equalization filter $H_{HF(s)}$ to the modulated target voltage $V_{TGT}$ to generate a modulated high-frequency target voltage $V_{TGT-HF}$. Herein, the modulated high-frequency target voltage $V_{TGT-HF}$ is configured to cause the high-frequency current generator 38 to generate the modulated high-frequency current $I_{CC-HF}$. In an embodiment, the high-frequency equalization filter $H_{HF(s)}$ may be related to the low-frequency equalization filter $H_{LF}(s)$ as in equation (Eq. 1).

$$H_{HF}(s) = 1 - H_{LF}(s) \quad \text{(Eq. 1)}$$

The sense current integrator 68 is configured to generate an adjustment term $\Delta ADJ$ to help eliminate any direct-current (DC) content that may be caused by the first multi-level voltage converter 56 and/or the second multi-level voltage converter 60. In an embodiment, each of the first multi-level voltage converter 56 and the second multi-level voltage converter 60 is configured to generate a respective one of a first sensed current $I_{SENSE1}$ and a second sensed current $I_{SENSE2}$ to indicate a respective DC content being caused by a respective one of the first multi-level voltage converter 56 and the second multi-level voltage converter 60. Accordingly, the sense current integrator 68 may generate the adjustment term $\Delta ADJ$ based on the first sensed current $I_{SENSE1}$ and the second sensed current $I_{SENSE2}$.

The high-frequency mixer 70 is configured to combine the modulated high-frequency target voltage $V_{TGT-HF}$, the adjustment term $\Delta ADJ$, and the offset target voltage $V_{OFF-TGT}$ to generate a high-frequency voltage target $V_{DC-TGT-HF}$ for setting the high-frequency PWM duty cycle signal $PWM_{HF}$. The high-frequency mixer 70 is configured to provide the high-frequency voltage target $V_{DC-TGT-HF}$ to respective positive inputs (denoted as "+") of the first high-voltage mode comparator 76, the first low-voltage mode comparator 78, the second high-voltage mode comparator 80, and the second low-voltage mode comparator 82.

The first high-frequency saw tooth oscillator 72 is configured to generate a first high-voltage mode target voltage $V_{HIGH1}$ and a first low-voltage mode target voltage $V_{LOW1}$ based on the high-frequency control signal 18. Similarly, the second high-frequency saw tooth oscillator 74 is configured to generate a second high-voltage mode target voltage $V_{HIGH2}$ and a second low-voltage mode target voltage $V_{LOW2}$ based on the high-frequency control signal 18.

The first high-frequency saw tooth oscillator 72 is further configured to provide the first high-voltage mode target voltage $V_{HIGH1}$ and the first low-voltage mode target voltage $V_{LOW1}$ to respective negative inputs (denoted as "−") of the first high-voltage mode comparator 76 and the first low-voltage mode comparator 78. Likewise, the second high-frequency saw tooth oscillator 74 is further configured to provide the second high-voltage mode target voltage $V_{HIGH2}$ and the second low-voltage mode target voltage $V_{LOW2}$ to respective negative inputs (denoted as "−") of the second high-voltage mode comparator 80 and the second low-voltage mode comparator 82.

The first high-frequency arbitration logic 84 is configured to generate the high-frequency PWM duty cycle signal $PWM_{HF}$ based on outputs from the first high-voltage mode comparator 76 and the first low-voltage mode comparator 78. Herein, the first high-frequency arbitration logic 84 is further configured to provide the high-frequency PWM duty cycle signal $PWM_{HF}$ to the first multi-level voltage converter 56.

The second high-frequency arbitration logic 86 is configured to generate the high-frequency PWM duty cycle signal $PWM_{HF}$ based on outputs from the second high-voltage mode comparator 80 and the second low-voltage mode comparator 82. Herein, the second high-frequency arbitration logic 86 is further configured to provide the high-frequency PWM duty cycle signal $PWM_{HF}$ to the second multi-level voltage converter 60.

Figure 4:
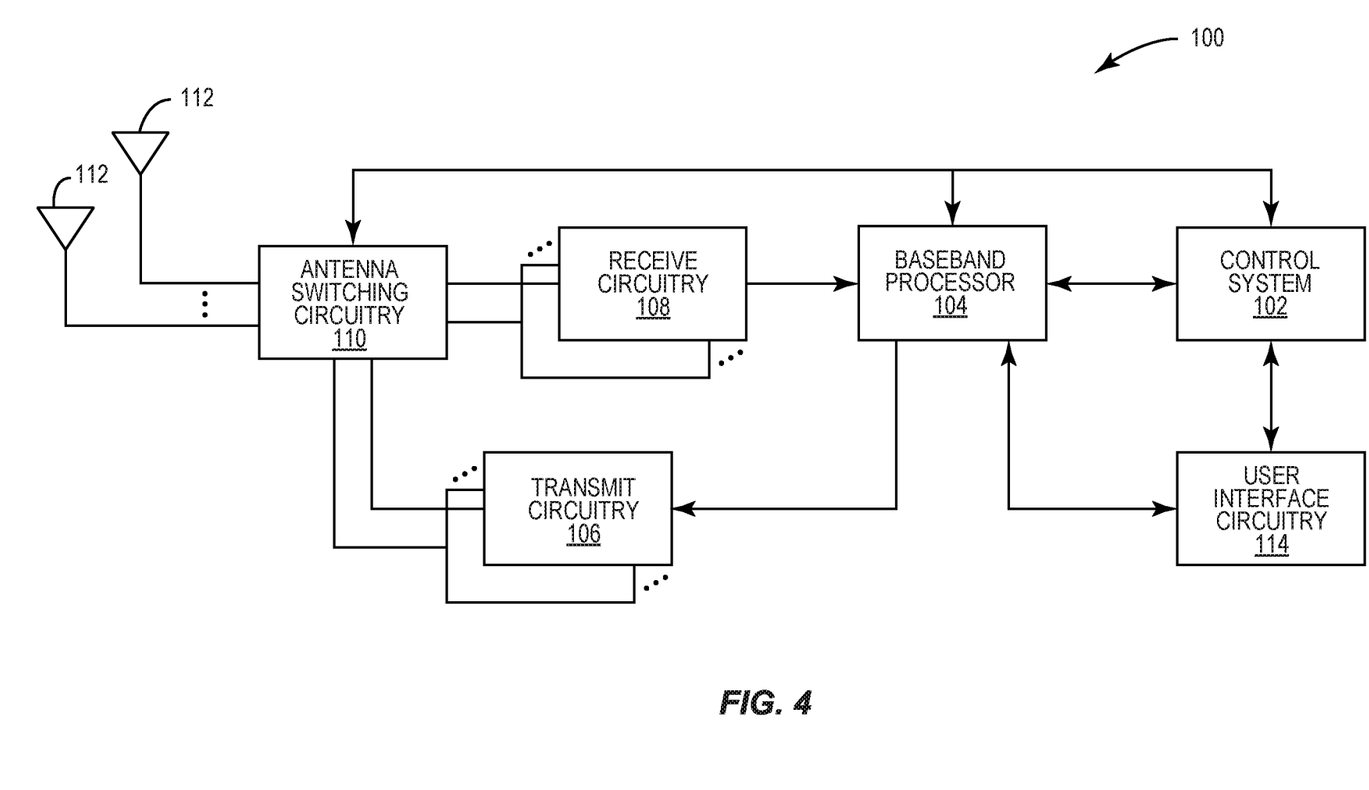
FIG. 4 is a schematic diagram of an exemplary user element wherein the PMIC of FIG. 1 can be provided.

The PMIC 10 of FIG. 1 can be provided in a user element to support the embodiments described above. In this regard, FIG. 4 is a schematic diagram of an exemplary user element 100 wherein the PMIC 10 of FIG. 1 can be provided.

Herein, the user element 100 can be any type of user elements, such as mobile terminals, smart watches, tablets, computers, navigation devices, access points, and like wireless communication devices that support wireless communications, such as cellular, wireless local area network (WLAN), Bluetooth, and near field communications. The user element 100 will generally include a control system 102, a baseband processor 104, transmit circuitry 106, receive circuitry 108, antenna switching circuitry 110, multiple antennas 112, and user interface circuitry 114. In a non-limiting example, the control system 102 can be a field-programmable gate array (FPGA), as an example. In this regard, the control system 102 can include at least a microprocessor(s), an embedded memory circuit(s), and a communication bus interface(s). The receive circuitry 108 receives radio frequency signals via the antennas 112 and through the antenna switching circuitry 110 from one or more base stations. A low noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams using analog-to-digital converter(s) (ADC).

The baseband processor 104 processes the digitized received signal to extract the information or data bits conveyed in the received signal. This processing typically comprises demodulation, decoding, and error correction operations, as will be discussed in greater detail below. The baseband processor 104 is generally implemented in one or more digital signal processors (DSPs) and application specific integrated circuits (ASICs).

For transmission, the baseband processor 104 receives digitized data, which may represent voice, data, or control information, from the control system 102, which it encodes for transmission. The encoded data is output to the transmit circuitry 106, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission, and deliver the modulated carrier signal to the antennas 112 through the antenna switching circuitry 110. The multiple antennas 112 and the replicated transmit and receive circuitries 106, 108 may provide spatial diversity. Modulation and processing details will be understood by those skilled in the art.

Figure 5:
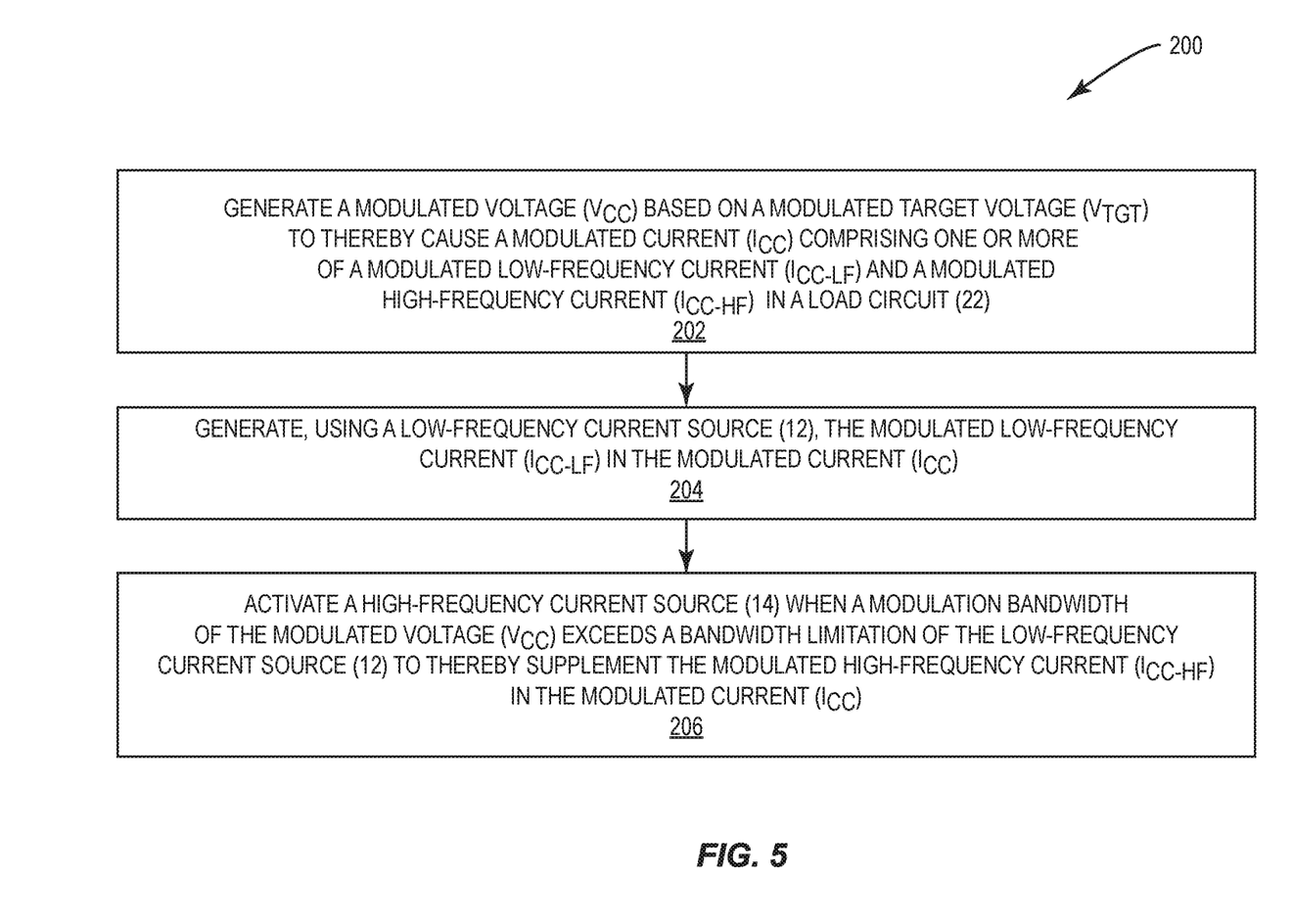
FIG. 5 is a flowchart of a process for operating the PMIC of FIG. 1.

The PMIC 10 of FIG. 1 can be operated based on a process. In this regard, FIG. 5 is a flowchart of an exemplary process 200 for operating the PMIC 10 of FIG. 1.

Herein, the process 200 includes generating the modulated voltage $V_{CC}$ based on the modulated target voltage $V_{TGT}$ to thereby cause the modulated current $I_{CC}$ including the modulated low-frequency current $I_{CC-LF}$ and/or the modulated high-frequency current $I_{CC-HF}$ in the load circuit 22 (step 202). The process 200 also includes generating, using the low-frequency current source 12, the modulated low-frequency current $I_{CC-LF}$ in the modulated current $I_{CC}$ (step 204). The process 200 also includes activating the high-frequency current source 14 when the modulation bandwidth of the modulated voltage $V_{CC}$ exceeds a bandwidth limitation of the low-frequency current source 12 to thereby supplement the modulated high-frequency current $I_{CC-HF}$ in the modulated current $I_{CC}$ (step 206).

Those skilled in the art will recognize improvements and modifications to the preferred embodiments of the present disclosure. All such improvements and modifications are considered within the scope of the concepts disclosed herein and the claims that follow.

What is claimed is:

1. A power management integrated circuit (PMIC) comprising:
   a voltage modulation circuit configured to generate a modulated voltage at a voltage output based on a modulated target voltage to thereby cause a modulated current comprising one or more of a modulated low-frequency current and a modulated high-frequency current in a load circuit coupled to the voltage output;
   a low-frequency current source configured to generate the modulated low-frequency current in the modulated current; and
   a high-frequency current source activated when a modulation bandwidth of the modulated voltage exceeds a bandwidth limitation of the low-frequency current source to thereby supplement the modulated high-frequency current in the modulated current.

2. The PMIC of claim 1, wherein the high-frequency current source is further configured to:
   source the modulated high-frequency current in the modulated current when the modulation bandwidth is above the bandwidth limitation and increases; and
   sink the modulated high-frequency current in the modulated current when the modulation bandwidth is above the bandwidth limitation but decreases.

3. The PMIC of claim 2, wherein the high-frequency current source is deactivated when the modulation bandwidth of the modulated voltage is below the bandwidth limitation of the low-frequency current source.

4. The PMIC of claim 1, wherein the low-frequency current source is further configured to generate the modulated low-frequency current comprising a constant current and a low-frequency alternating current, wherein the constant current is equal to a root-mean-square (RMS) average of the modulated current.

5. The PMIC of claim 4, wherein the low-frequency current source comprises:
   a low-frequency control circuit configured to apply a low-frequency equalization filter to the modulated target voltage to thereby generate a low-frequency pulse-width-modulation (PWM) duty cycle signal; and
   a low-frequency current generator configured to generate the modulated low-frequency current as a function of a battery voltage and in accordance with the low-frequency PWM duty cycle signal.

6. The PMIC of claim 5, wherein the low-frequency current generator comprises:
   a multi-level charge pump (MCP) configured to generate a low-frequency voltage as a function of the battery voltage in accordance with the low-frequency PWM duty cycle signal; and
   a power inductor coupled to the voltage output and configured to induce the modulated low-frequency current based on the low-frequency voltage.

7. The PMIC of claim 6, wherein the low-frequency control circuit comprises:
   a low-frequency equalizer configured to apply the low-frequency equalization filter to the modulated target voltage to generate a modulated low-frequency target voltage;
   a loop filter configured to generate an offset voltage error to thereby cause the low-frequency current generator to adjust the constant current in the modulated low-frequency current;
   a low-frequency mixer configured to combine the modulated low-frequency target voltage and the offset voltage error to generate a low-frequency voltage target for setting the low-frequency PWM duty cycle signal;
   a low-frequency saw tooth oscillator configured to generate a boost-mode target voltage and a buck-mode target voltage based on a low-frequency control signal;

a boost-mode comparator configured to compare the buck-mode target voltage against the low-frequency voltage target;
a buck-mode comparator configured to compare the boost-mode target voltage against the low-frequency voltage target; and
a low-frequency arbitration logic configured to generate the low-frequency PWM duty cycle signal based on outputs from the boost-mode comparator and the buck-mode comparator.

8. The PMIC of claim 5, wherein the high-frequency current source comprises:
a high-frequency control circuit configured to apply a high-frequency equalization filter to the modulated target voltage to thereby generate a high-frequency pulse-width-modulation (PWM) duty cycle signal; and
a high-frequency current generator configured to generate the modulated high-frequency current in accordance with the high-frequency PWM duty cycle signal.

9. The PMIC of claim 8, wherein the high-frequency PWM duty cycle signal is at least ten times faster than the low-frequency PWM duty cycle signal.

10. The PMIC of claim 8, wherein the high-frequency current generator comprises:
a first multi-level voltage converter configured to generate a first voltage in accordance with the high-frequency PWM duty cycle signal;
a first power inductor coupled between the first multi-level voltage converter and a converging node, the first power inductor is configured to induce a first high-frequency alternating current based on the first voltage;
a second multi-level voltage converter configured to generate a second voltage in accordance with the high-frequency PWM duty cycle signal; and
a second power inductor coupled between the second multi-level voltage converter and the converging node, the second power inductor is configured to induce a second high-frequency alternating current based on the first second voltage.

11. The PMIC of claim 10, wherein the first voltage and the second voltage are so generated to have a one-hundred eighty degrees (180°) phase offset to cancel an unwanted ripple in one or more of the first voltage and the second voltage.

12. The PMIC of claim 11, wherein the high-frequency current generator further comprises:
a first inductor-capacitor (LC) filter coupled in parallel to the first power inductor between the first multi-level voltage converter and the converging node; and
a second LC filter coupled in parallel to the second power inductor between the second multi-level voltage converter and the converging node;
wherein the first LC filter and the second LC filter are configured to cancel the unwanted ripple at one of a certain parallel resonance frequency and a certain harmonic frequency.

13. The PMIC of claim 10, wherein the high-frequency control circuit comprises:
a high-frequency equalizer configured to apply the high-frequency equalization filter to the modulated target voltage to generate a modulated high-frequency target voltage;
a sense current integrator configured to generate an adjustment term to thereby eliminate any direct-current (DC) content caused by one or more of the first multi-level voltage converter and the second multi-level voltage converter;

a high-frequency mixer configured to combine the modulated high-frequency target voltage, the adjustment term, and an offset target voltage to generate a high-frequency voltage target;
a first high-frequency saw tooth oscillator configured to generate a first high-voltage mode target voltage and a first low-voltage mode target voltage;
a first high-voltage mode comparator configured to compare the first high-voltage mode target voltage against the high-frequency voltage target;
a first low-voltage mode comparator configured to compare the first low-voltage mode target voltage against the high-frequency voltage target;
a first high-frequency arbitration logic configured to generate the high-frequency PWM duty cycle signal based on outputs from the first high-voltage mode comparator and the first low-voltage mode comparator;
a second high-frequency saw tooth oscillator configured to generate a second high-voltage mode target voltage and a second low-voltage mode target voltage;
a second high-voltage mode comparator comparing the second high-voltage mode target voltage against the high-frequency voltage target;
a second low-voltage mode comparator comparing the second low-voltage mode target voltage against the high-frequency voltage target; and
a second high-frequency arbitration logic generating the high-frequency PWM duty cycle signal based on outputs from the first high-voltage mode comparator and the first low-voltage mode comparator.

14. The PMIC of claim 1, wherein the voltage modulation circuit comprises:
a voltage modulator configured to generate a modulated initial voltage based on the modulated target voltage and a selected one of a plurality of supply voltages; and
an offset capacitor having an input node coupled to the voltage modulator and an output node coupled to the voltage output, the offset capacitor is configured to raise the modulated initial voltage by an offset voltage to thereby generate the modulated voltage at the voltage output.

15. The PMIC of claim 14, wherein the high-frequency current source is coupled to the input node of the offset capacitor to thereby cause the modulated high-frequency current to flow through the offset capacitor.

16. A wireless device comprising:
a power amplifier circuit; and
a power management integrated circuit (PMIC) comprising:
a voltage output coupled to the power amplifier circuit;
a voltage modulation circuit configured to generate a modulated voltage at the voltage output based on a modulated target voltage to thereby cause a modulated current comprising one or more of a modulated low-frequency current and a modulated high-frequency current in the power amplifier circuit;
a low-frequency current source configured to generate the modulated low-frequency current in the modulated current; and
a high-frequency current source activated when a modulation bandwidth of the modulated voltage exceeds a bandwidth limitation of the low-frequency current source to thereby supplement the modulated high-frequency current in the modulated current.

17. The wireless device of claim 16, further comprising a transceiver circuit coupled to the low-frequency current source and the high-frequency current source and configured to:
  activate the high-frequency current source when the modulation bandwidth of the modulated voltage exceeds the bandwidth limitation; and
  deactivate the high-frequency current source when the modulation bandwidth of the modulated voltage falls below the bandwidth limitation.

18. The wireless device of claim 16, wherein the low-frequency current source comprises:
  a low-frequency control circuit configured to apply a low-frequency equalization filter to the modulated voltage to thereby generate a low-frequency pulse-width-modulation (PWM) duty cycle signal; and
  a low-frequency current generator configured to generate the modulated low-frequency current as a function of a battery voltage and in accordance with the low-frequency PWM duty cycle signal.

19. The wireless device of claim 16, wherein the high-frequency current source comprises:
  a high-frequency control circuit configured to apply a high-frequency equalization filter to the modulated voltage to thereby generate a high-frequency pulse-width-modulation (PWM) duty cycle signal; and
  a high-frequency current generator configured to generate the modulated high-frequency current in accordance with the high-frequency PWM duty cycle signal.

20. A method for operating a power management integrated circuit (PMIC) comprising:
  generating a modulated voltage based on a modulated target voltage to thereby cause a modulated current comprising one or more of a modulated low-frequency current and a modulated high-frequency current in a load circuit;
  generating, using a low-frequency current source, the modulated low-frequency current in the modulated current; and
  activating a high-frequency current source when a modulation bandwidth of the modulated voltage exceeds a bandwidth limitation of the low-frequency current source to thereby supplement the modulated high-frequency current in the modulated current.

21. A power management integrated circuit (PMIC) comprising:
  a voltage modulation circuit configured to generate a modulated voltage at a voltage output based on a modulated target voltage to thereby cause a modulated current comprising one or more of a modulated low-frequency current and a modulated high-frequency current in a load circuit coupled to the voltage output;
  a low-frequency current source configured to generate the modulated low-frequency current in the modulated current based on a low-frequency pulse-width-modulation (PWM) duty cycle signal; and
  a high-frequency current source activated when a modulation bandwidth of the modulated voltage exceeds a bandwidth limitation of the low-frequency current source to thereby supplement the modulated high-frequency current in the modulated current based on a high-frequency PWM duty cycle signal at least ten times faster than the low-frequency PWM duty cycle signal.

* * * * *